(12) United States Patent
Ikarashi

(10) Patent No.: US 6,359,522 B1
(45) Date of Patent: Mar. 19, 2002

(54) VOLTAGE-CONTROLLED OSCILLATOR PREVENTING IRREGULAR OSCILLATION

(75) Inventor: Yasuhiro Ikarashi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/651,633

(22) Filed: Aug. 30, 2000

(30) Foreign Application Priority Data

Aug. 31, 1999 (JP) ............................................. 11-246282

(51) Int. Cl.$^7$ ................................................. H03B 5/00
(52) U.S. Cl. ............................... 331/117 D; 331/117 R; 331/107 SL; 331/108 C
(58) Field of Search ......................... 331/117 D, 117 R, 331/107 SL, 108 C, 99, 108 D

(56) References Cited

U.S. PATENT DOCUMENTS 5,440,276 A  8/1995  Kim ...................... 331/117 FE

FOREIGN PATENT DOCUMENTS

JP  Hei 6-224632  8/1994

*Primary Examiner*—Arnold Kinkead
(74) *Attorney, Agent, or Firm*—Brinks Hofer Gilson & Lione

(57) ABSTRACT

There is provided a voltage-controlled oscillator which prevents generation of an irregular oscillation signal, reduces the number of parts including large size elements, realizes reduction in size of structure and easily adjusts output level of the oscillation signal. An oscillating transistor which operates in a grounded base system to output an oscillation signal, an amplifying transistor which operates in a grounded emitter system to amplify the oscillation signal and a resonance circuit connected to the collector of the oscillating transistor are provided. The resonance circuit is provided with a resonance micro-strip line with an intermediate tap connected in a DC circuit provided between the collector of the oscillating transistor and the emitter of the amplifying transistor and a resonance capacitor connected between the collector of the oscillating transistor and the ground point, and a coupling capacitance to transmit the oscillation signal is connected between the intermediate tap of the resonance micro-strip line and the base of the amplifying transistor.

3 Claims, 4 Drawing Sheets

VOLTAGE-CONTROLLED OSCILLATOR PREVENTING IRREGULAR OSCILLATION

BACKGROUND OF THE INVENTION

1. Field of the Invention

The present invention relates to a voltage-controlled oscillator and particularly to a voltage-controlled oscillator in which an oscillating transistor and an amplifying transistor are connected in series in a DC manner and a resonance circuit is connected to the collector of oscillating transistor in view of preventing generation of irregular oscillation and enabling output level adjustment of the oscillation signal.

2. Description of the Related Art

There has been provided a voltage-controlled oscillator wherein an oscillating transistor and an amplifying transistor are connected in a DC manner and a resonance circuit is connected to the collector of the oscillating transistor. This voltage-controlled oscillator supplies an oscillation signal output from the emitter of an oscillating transistor to the base of an amplifying transistor, and outputs the oscillation signal from the collector of an amplifying transistor. Moreover, in this voltage-controlled oscillator, an irregular oscillation signal is sometimes generated in the frequency considerably lower than the frequency of oscillation signal with the influence of inductance connected in series to the collector of the oscillating transistor, and thereby generation of the irregular oscillation signal interferes with the intrinsic oscillation signal. Therefore, the irregular oscillation control circuit to control generation of irregular oscillation signal is, in more practical terms, an irregular oscillation control circuit connecting in series an inductor and a resistor connected to a series circuit between the collector of the oscillating transistor and the emitter of amplifying transistor.

Here, FIG. 4 is a circuit diagram illustrating an example of the structure of the well-known voltage controlled oscillator explained above.

As illustrated in FIG. 4, the typical voltage-controlled oscillator is composed of an oscillating active circuit portion 41, a resonance circuit portion 42, an oscillation signal output terminal 43, a power supply terminal 44, a frequency setting voltage supply terminal 45 and an irregular oscillation control circuit 46.

In this case, the oscillating active circuit portion 41 comprises a first transistor (oscillating transistor) $41_1$, a second transistor (amplifying transistor) $41_2$, a first coupling capacitor $41_3$, a first feedback capacitor $41_4$, a second feedback capacitor $41_5$, an emitter resistor $41_6$, a second coupling capacitor $41_7$, a first base bias setting resistor $41_8$, a second base bias setting resistor $41_9$, a third base bias setting resistor $41_{10}$, a first bypass capacitor $41_{11}$, a second bypass capacitor $41_{12}$, a third coupling capacitor $41_{13}$, a load inductor $14_{14}$, a smoothing capacitor $41_{15}$, and also an irregular oscillation control circuit 46. The resonance circuit portion 42 comprises a resonance inductor $42_1$, a varactor diode $42_2$, a DC cut-off capacitor $42_3$, a buffer inductor $42_4$, and a smoothing capacitor $42_5$. The resonance circuit portion 42 forms a resonance circuit mainly with the resonance inductor $42_1$, and the varactor diode $42_2$. The irregular oscillation control circuit 46 comprises an inductor $46_1$, and a resistor $46_2$.

Each structural element $41_1$ to $41_{15}$ forming the oscillating active circuit portion 41 and each structural element $42_1$ to $42_5$ forming the resonance circuit portion 42 are connected as illustrated in FIG. 4.

The well-known voltage controlled oscillator of the structure explained above operates as will be explained below.

When a frequency setting voltage is applied to a frequency setting voltage supply terminal 45, this frequency setting voltage is impressed to a cathode of the varactor diode $42_2$ through the buffer inductor $42_4$ to set a capacitance value of the varactor diode $42_2$ corresponding to the frequency setting voltage. In this case, a resonance circuit consisting of the resonance inductor $42_1$ and varactor diode $42_2$ resonates at the frequency determined by the inductance value of resonance inductor $42_1$ and capacitance value of varactor diode $42_2$. During resonance of the resonance circuit, the oscillating active circuit portion 41 shows a negative resistance when the oscillation active circuit portion 41 is viewed from the resonance circuit portion 42. Therefore, a signal in the frequency identical to the resonance frequency is generated in the resonance circuit 42. When the frequency setting voltage to be supplied to the frequency setting voltage supply terminal 45 is changed, the capacitance value of the varactor diode $42_2$ changes depending on such change and thereby the frequency of the frequency signal generated in the resonance circuit 42 also changes.

The oscillating active circuit portion 41 outputs, when the signal in the frequency identical to the resonance frequency is generated in the resonance circuit, such frequency signal from the emitter of the first transistor $41_1$ as the oscillation signal and supplies this oscillation signal to the base of the second transistor $41_2$ via the second coupling capacitor $41_7$. The second transistor $41_2$ amplifies the supplied oscillation signal under the grounded-emitter system and supplies the oscillation signal to the oscillation signal output terminal 43 from its collector via the third coupling capacitor $41_{13}$.

The oscillating active circuit portion 41 inserts an irregular oscillation control circuit 46 connecting in series the inductor $46_1$ and the resistor $46_2$ within the DC circuit between the collector of the first transistor $41_1$ and the emitter of the second transistor $41_2$. This irregular oscillation control circuit 46 impedes the irregular oscillation signal which is generated in the frequency considerably lower than the oscillation frequency signal supplied to the emitter of the second transistor $41_2$ from the collector of first transistor $41_1$ and also prevents, with connection of the irregular oscillation control circuit 46, that the irregular oscillation signal is supplied to the oscillation signal output terminal via the third coupling capacitor $41_{13}$ from the collector of the second transistor $41_2$.

In this case, a resistor $46_2$ used in the irregular oscillation control circuit 46 preferably has a resistance value as small as possible because it is connected to a DC circuit and generally it has the resistance value of 10 to 50 Ω.

The well-known voltage controlled oscillator described above has a merit that it can output the oscillation signal of the predetermined frequency band without generation of irregular oscillation; but it requires, on the other hand, insertion of the irregular oscillation control circuit 46 connecting in series the inductor $46_1$ and resistor $46_2$ within the oscillating active circuit portion 41 in order to control the irregular oscillation signal. Therefore, the number of parts increases and manufacturing cost rises as much in comparison with the voltage-controlled oscillator of this type where the irregular oscillation control circuit 46 is not inserted.

Moreover, the voltage-controlled oscillator of the related art includes an inductor $46_1$ which is a large size electronic part requiring a large physical volume within the irregular oscillation control circuit 46 inserted to the oscillating active circuit portion 41 and therefore it is considerably difficult to reduce the size of total structure of the voltage-controlled oscillator.

Moreover, the voltage-controlled oscillator of the related art does not include an oscillation signal output level adjusting member. Accordingly, when it is requested to adjust the oscillation signal output level, the second transistor $41_2$ must be replaced with one having a different amplification degree and the second coupling capacitor $41_7$ must be replaced with one having a different capacitance value. Namely, many adjusting processes are required for output level adjustment of the oscillation signal.

SUMMARY OF THE INVENTION

The present invention has been proposed considering the technical background explained above and it is therefore an object of the present invention to provide a voltage-controlled oscillator which can reduce the number of parts, including large size electronic parts, and enables reduction in size of structure by eliminating the factor for generating irregular oscillation signal, and also can easily adjust the output level of oscillation signal.

In view of attaining the object explained above, the voltage-controlled oscillator of the present invention comprises an oscillating transistor which operates in a grounded-base system to output an oscillation signal, an amplifying transistor which operates in the grounded-emitter system to output an oscillation signal, and a resonance circuit connected to the collector of an oscillating transistor. The resonance circuit has a structure that a micro-strip line with an intermediate tap connected within a DC circuit between the collector of the oscillating transistor and the emitter of the amplifying transistor and a resonance capacitor connected between the collector of the oscillating transistor and the ground point are provided, and a coupling capacitor to transmit the oscillation signal is connected between the intermediate tap of the micro-strip line and the base of the amplifying transistor.

A mounting structure of the voltage-controlled oscillator of the structure explained above is composed of an upper layer on which individual structural elements insulated and provided opposed to each other including the oscillating transistor and amplifying transistor are mounted, an intermediate layer forming the micro-strip line and a lower layer forming the grounding layer, wherein a first conductive pattern and a second conductive pattern respectively forming the coupling capacitors to the upper layer and intermediate layer are provided opposed to each other, the first conductive pattern is connected to the intermediate tape of the micro-strip line and the second conductive pattern is connected to the base of the amplifying transistor.

According to the structure explained above, the resonance micro-strip line of the resonance circuit which can also be used in common as the power feeding line is inserted and connected, in place of the irregular oscillation control circuit, in a DC circuit between the collector of the oscillating transistor and the emitter of the amplifying transistor. Therefore, the resonance circuit may be structured with the resonance micro-strip line and resonance capacitor, and since an inductor which is the factor to generate irregular oscillation is not used, irregular oscillation can be prevented. In regard to the number of parts used in the voltage-controlled oscillator, since the structural elements of the irregular oscillation control circuit may be reduced by using at least the resonance micro-strip line and moreover the part to be reduced is a large size inductor element, the total structure of the voltage-controlled oscillator can be reduced in size in comparison with the total structure of the voltage-controlled oscillator of the prior art.

Moreover, according to the structure explained above, the output level of the oscillation signal can be adjusted simply, because the coupling capacitor for transmitting the oscillation signal is connected between the intermediate tap of the micro-strip line and the base of amplifying transistor; and the output level of the oscillation signal can be adjusted by changing the forming point and forming condition of the intermediate tap of the micro-strip line.

DETAILED DESCRIPTION OF THE PREFERRED EMBODIMENT

A preferred embodiment of the present invention will be explained with reference to the accompanying drawings.

Figure 1:
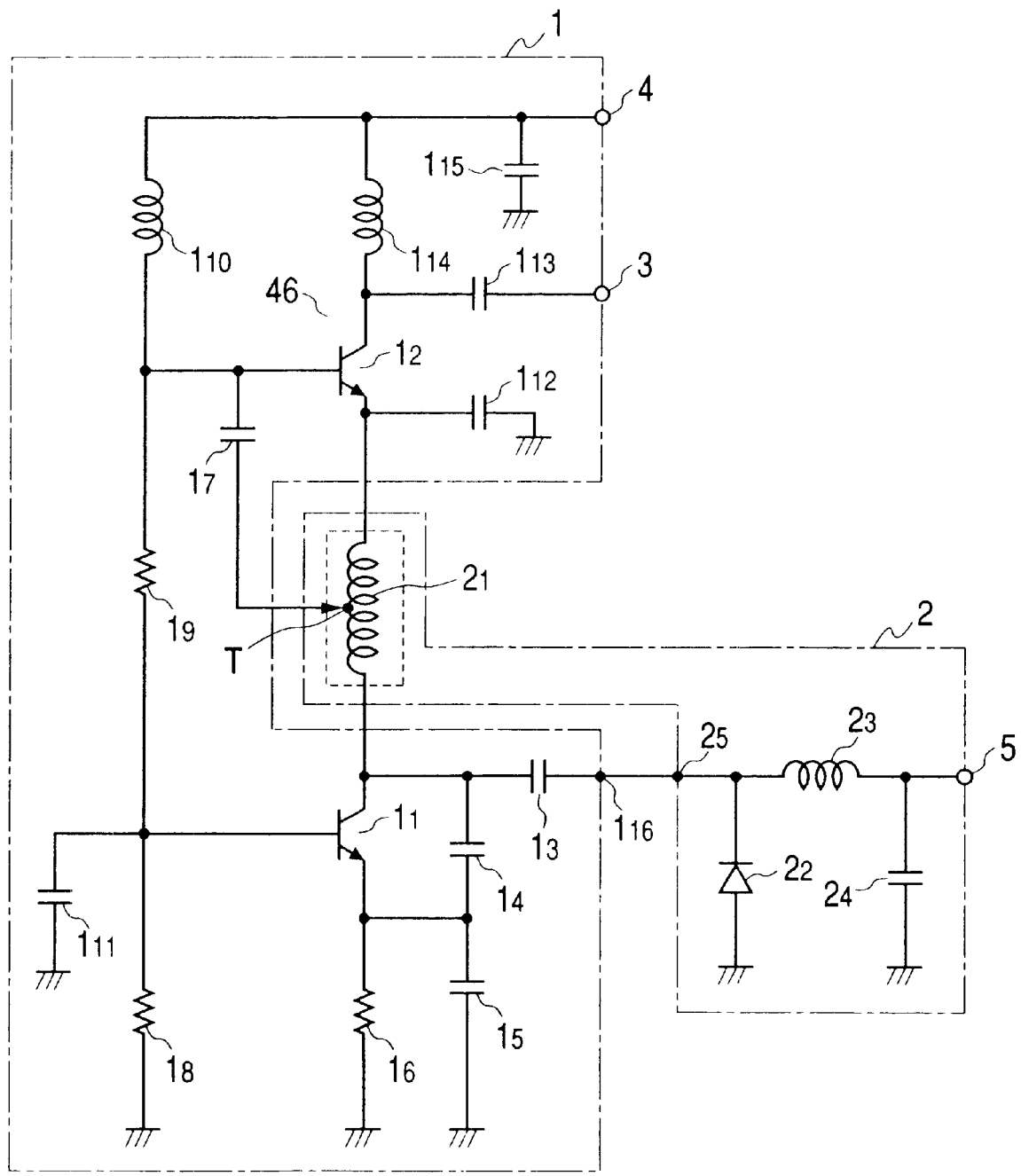
FIG. 1 is a circuit configuration diagram illustrating a preferred embodiment of the voltage-controlled oscillator of the present invention.

FIG. 1 is a circuit configuration diagram illustrating an embodiment of the voltage-controlled oscillator of the present invention.

As illustrated in FIG. 1, the voltage-controlled oscillator of this embodiment is composed of an oscillating active circuit 1, a resonance circuit 2, an oscillation signal output terminal 3, a power source terminal 4 and a frequency setting voltage supply terminal 5.

In this case, the oscillating active circuit 1 comprises a first transistor (oscillating transistor) $1_1$, a second transistor (amplifying transistor) $1_2$, a first coupling capacitor $1_3$, a first feedback capacitor $1_4$, a second feedback capacitor $1_5$, an emitter resistor $1_6$, a second coupling capacitor $1_7$, a first base bias setting resistor $1_8$, a second base bias setting resistor $1_9$, a third base bias setting resistor $1_{10}$, a first bypass capacitor $1_{11}$, a second bypass capacitor $1_{12}$, a third coupling capacitor $1_{13}$, a load inductor $1_{14}$, a smoothing capacitor $1_{15}$ and a resonance circuit coupling end $1_{16}$. The resonance circuit 2 is composed of a resonance micro-strip line $2_1$ with intermediate tap T, a varactor diode $2_2$, a buffer inductor $2_3$, a smoothing capacitor $2_4$ and an active circuit coupling end $2_5$. The resonance circuit 2 mainly forms the resonance circuit with a resonance micro-strip line $2_1$ and a resonance capacitor (varactor diode) $2_2$.

The resonance circuit coupling end $1_{16}$ of the oscillating active circuit 1 and the active circuit coupling end $2_5$ of the resonance circuit 2 are connected, and the resonance circuit 2 is connected to the oscillating active circuit 1. In this case, the oscillating active circuit 1 connects in series, between the power source terminal 4 and the ground, a load inductor $1_{14}$, collector and emitter path of a second transistor $1_2$, a resonance micro-strip line $2_1$, collector and emitter path of a first transistor $1_1$ and an emitter resistor $1_6$ in this sequence and also connects, in parallel to above, a third base bias setting resistor $1_{10}$, a second base bias setting resistor $1_9$ and a first base bias setting register $1_8$ in this sequence. The connecting point of the third base bias setting resistor $1_{10}$ and the second base bias setting resistor $1_9$ is connected to the base of the second transistor $1_2$, and the connecting point of the second base bias setting resistor $1_9$ and the first base bias setting resistor $1_8$ is connected to the base of the first transistor $1_1$. The first transistor $1_1$ is connected to the ground at its base via the first bypass capacitor $1_{11}$ and to the resonance circuit coupling end $1_{16}$ at its collector via the first coupling capacitor $1_3$. Moreover, the first transistor $1_1$ connects the first feedback capacitor $1_4$ between the collector and emitter and the second feedback capacitor $1_5$ between the emitter and the ground. The second transistor $1_2$ its connected to the ground point at is emitter via the second bypass capacitor $1_{12}$ and to the intermediate tap T of the resonance micro-strip line $2_1$ at its base via the second coupling capacitor $1_7$ and to the oscillating signal output terminal 3 at its collector via the third coupling capacitor $1_{13}$. Moreover, the resonance circuit 2 connects the active circuit coupling end $2_5$ to the cathode of varactor diode $2_2$ and also connects the anode of varactor diode $2_2$ to the ground point. The buffer inductor $2_3$ is connected between the active circuit coupling end $2_5$ and frequency setting voltage supply terminal 5, and the smoothing capacitor $2_4$ is connected between the frequency setting voltage supply terminal 5 and the ground point.

The voltage-controlled oscillator of this embodiment of the structure explained above operates as explained below.

When the frequency setting voltage is supplied to the frequency setting voltage supply terminal 5, this frequency setting voltage is impressed to the cathode of the varactor diode $2_2$ via the buffer inductor $2_3$. The varactor diode $2_2$ is connected to the ground point at its anode, and therefore it is set to the capacitance value corresponding to the frequency setting voltage applied. In this case, the resonance circuit consisting of the resonance inductor $2_1$ and varactor diode $2_2$ resonates at the frequency determined by the inductance value of the resonance inductor $2_1$ and the capacitance value of the varactor diode $2_2$. When the resonance circuit resonates, the oscillating active circuit 1 shows a negative resistance when this circuit is viewed from the resonance circuit 2. Therefore, the oscillation signal of the frequency equal to the resonance frequency of the resonance circuit is generated in the oscillating active circuit 1.

When the frequency setting voltage supplied to the frequency setting voltage supply terminal 5 is changed, the capacitance value of varactor $2_2$ is also changed depending on the changed frequency setting voltage to change the frequency of frequency signal generated in the resonance circuit.

The oscillation signal generated in the oscillating active circuit 1 is output from the intermediate tap T of the resonance micro-strip line $2_1$ connected to the collector of the first transistor $1_1$ and is then supplied to the base of the second transistor $1_2$ via the second coupling capacitor $1_7$. The second transistor $1_2$ amplifies the supplied oscillation signal in the grounded-emitter system and this oscillation signal to the oscillating signal output terminal 3 from the collector thereof via the third coupling capacitor $1_{13}$.

In this case, in the voltage-controlled oscillator of this embodiment, the resonance micro-strip line $2_1$ forming the resonance circuit is inserted in the DC circuit connected between the collector of the first transistor $1_1$ of the oscillating active circuit 1 and the emitter of the second transistor $1_2$. When this resonance micro-strip line $2_1$ is used, since an inductor which is a factor for generating irregular oscillation is not used, it is now possible to prevent generation of irregular oscillating signal generated in the frequency band considerably lower than the oscillating frequency signal and moreover it is no longer required to use a resistor $46_2$ of the small resistance value which has been used in the irregular oscillation control circuit 6 of the prior art.

Moreover, in the voltage-controlled oscillator of this embodiment, since the oscillating signal is output from the intermediate tap T of the resonance micro-strip line $2_1$, the output level of oscillation signal can be adjusted by adequately changing a forming point of the intermediate tap T of the resonance micro-strip line $2_1$ or adequately changing the coupling condition of the resonance micro-strip line $2_1$ and the intermediate tap T.

Figure 4:
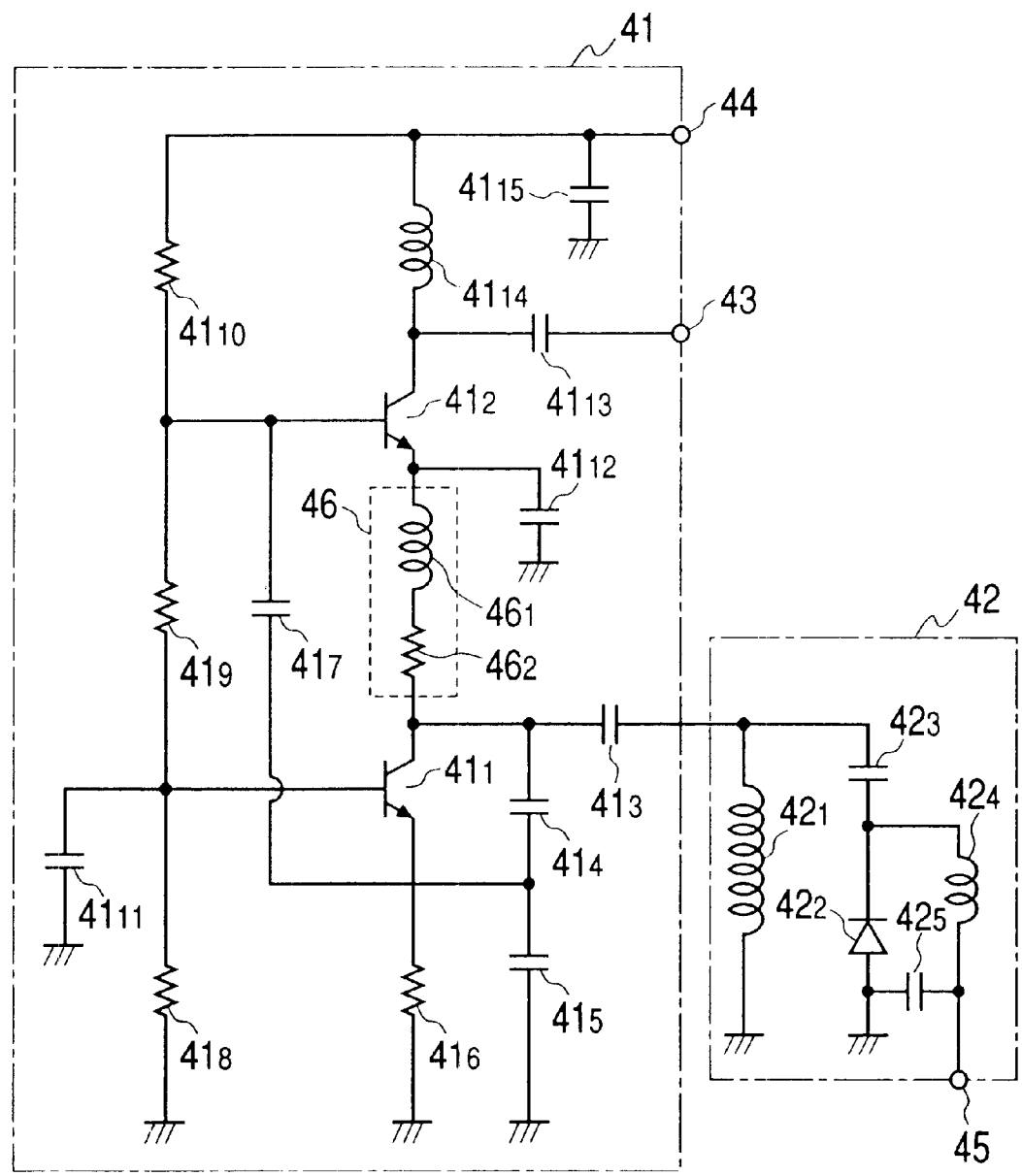
FIG. 4 is a circuit diagram illustrating an example of the structure of the voltage-controlled oscillator of the prior art.

In comparison of the voltage-controlled oscillator of this embodiment (hereinafter, referred to as former) with the well-known voltage-controlled oscillator of the prior art illustrated in FIG. 4 (hereinafter referred to as latter), the former uses the resonance micro-strip line $2_1$ and therefore it neither require the structural elements (inductor $46_1$ and resistor $46_2$) forming the latter irregular oscillation control circuit 46 nor the partial structural element (second coupling capacitor $41_7$) forming the latter oscillating active circuit 41. Namely, the former uses a smaller number of structural parts than the latter.

Figure 2:
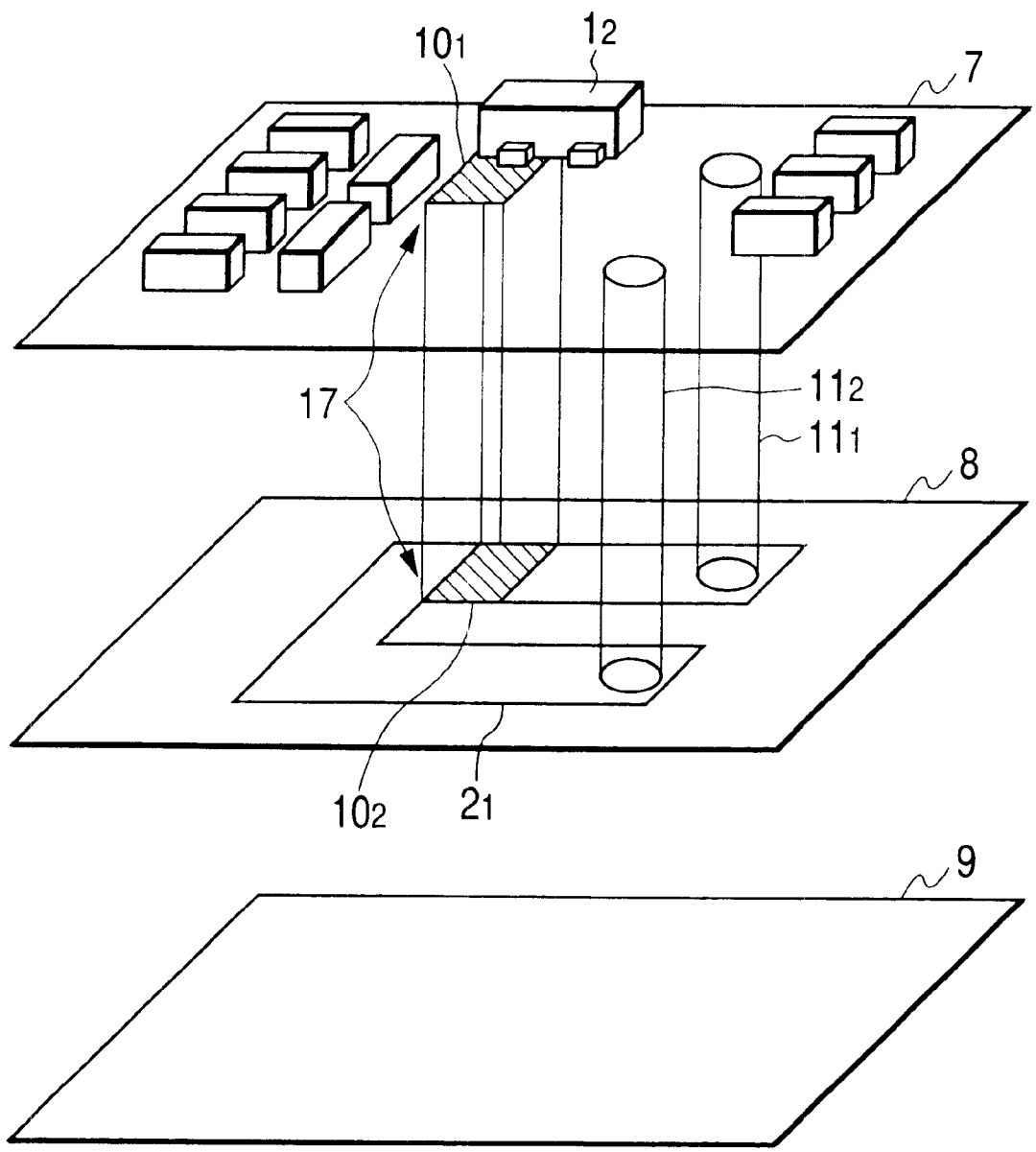
FIG. 2 is an exploded perspective view illustrating an example of the mounting structure on the occasion of mounting the voltage-controlled oscillator illustrated in FIG. 1.

Next, FIG. 2 is an exployed perspective view illustrating an example of the mounting structure when the voltage-controlled oscillator illustrated in FIG. 1 is mounted. In FIG. 2, the structural elements like those in FIG. 1 are designated with the like reference numerals.

As illustrated in FIG. 2, the mounting structure of this embodiment is formed of an upper layer 7, an intermediate layer 8 and a lower layer 9 which are arranged opposed to each other under the insulated condition.

On the upper layer 7, individual structural elements such as a first transistor (oscillating transistor, not shown) and a second transistor (amplifying transistor) $1_2$ or the like are mounted and a conductor pattern (not shown) for connecting each structural element, and one electrode (first conductive pattern) $10_1$ forming the second coupling capacitor $1_7$ are also formed. On the intermediate layer 8, the resonance micro-strip line $2_1$ with the intermediate tap T and the other electrode (second conductor pattern) $10_2$ forming the second coupling capacitor $1_7$ are formed. The lower layer 9 forms a ground layer. Moreover, first and second through holes $11_1$, $11_2$ indicating the electrical conductive condition are respectively formed between upper layer 7 and intermediate layer 8 corresponding to both ends of the resonance micro-strip line $2_1$.

The one electrode $10_1$ forming the second coupling capacitor $1_7$ is formed under the condition that it is connected to the base of the second transistor $1_2$ on the upper layer 7 and the other electrode $10_2$ forming the second coupling capacitor $1_7$ is formed of a part of the resonance micro-strip line $2_1$ formed on the intermediate layer 8. The one electrode $10_1$ and the other electrode $10_2$ are provided opposed to each other in the adjacent condition. Thereby, the second coupling capacitor $1_7$ having the capacitance set depending on the size and interval of the one electrode $10_1$ and the other electrode $10_2$ is formed between the one electrode $10_1$ and the other electrode $10_2$.

In this case, since the level of oscillation signal supplied to the second coupling capacitance $1_7$ changes by changing the forming position of the one electrode $10_1$ on the resonance micro-strip line $2_1$, namely the position of the intermediate tap T, when the position of intermediate tap T is selected to obtain the required oscillation signal level, the output level of oscillation signal can be adjusted. For instance, when the position of intermediate tap T is closed to one end side (collector side of the first transistor $1_1$) of the resonance micro-strip line $2_1$, output level of the oscillation signal increases and on the other hand, when the position of intermediate tap T is closed to the other end side (emitter side of the second transistor $1_2$) of the resonance micro-strip line $2_1$, the output level of the oscillation signal is reduced.

Figure 3:
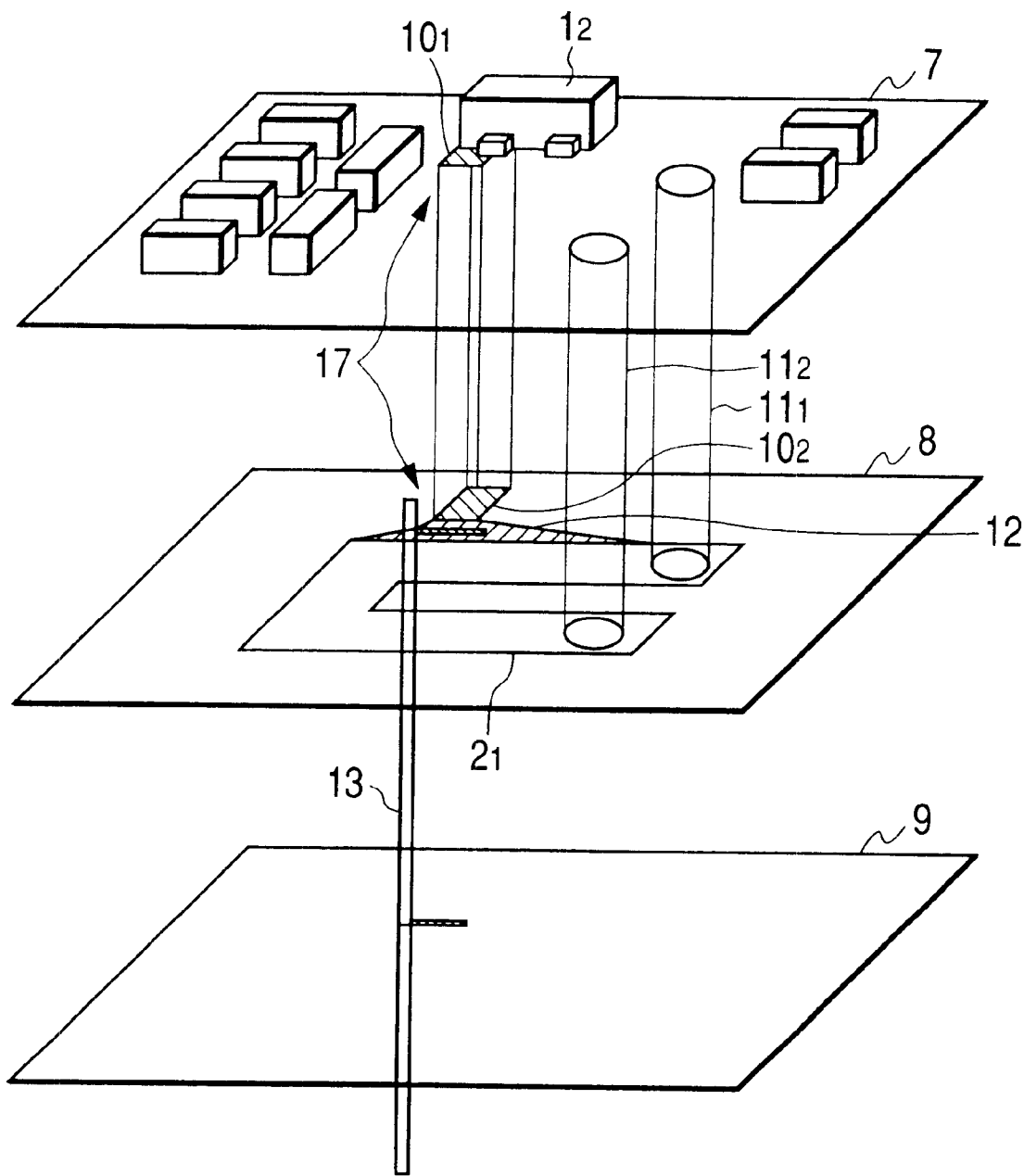
FIG. 3 is an exploded perspective view illustrating another example of the mounting structure on the occasion of mounting the voltage-controlled oscillator illustrated in FIG. 1.

Next, FIG. 3 is an exployed perspective view illustrating another example of the mounting structure when the voltage-controlled oscillator illustrated in FIG. 1 is mounted.

In FIG. 3, the structural elements like those illustrated in FIG. 1 and FIG. 2 are designated with the like reference numerals. Numeral 12 designates the wide area of the resonance micro-strip line 21.

Difference of structures between the mounting structure illustrated in FIG. 3 (hereinafter, referred to as the second mounting structure) and the mounting structure illustrated in FIG. 2 (hereinafter, referred to as the first mounting structure) is only the forming condition of the other electrode $10_2$ of the second coupling capacitance $1_2$. In more practical terms the other electrode $10_2$ is used as a part of the resonance micro-strip line $2_1$ in the first mounting structure, while the other electrode $10_2$ is independently formed and connected in conductive to the wide area 12 of the resonance micro-strip line $2_1$ in the second mounting structure. Moreover, since there is no structural difference in the second and first mounting structures, further explanation of the second mounting structure will be omitted here.

In this case, in place of adjusting the level of oscillation signal by adjusting the forming position of the other electrode $10_2$ on the resonance micro-strip line $2_1$, namely the position of the intermediate tap T like the first mounting structure, in the second mounting structure, when the voltage-controlled oscillator is manufactured, the cuttings of adequate length and numbers are given to the wider area of the resonance micro-strip line $2_1$ using a processing member $1_3$ such as an adjusting drill and laser as illustrated in FIG. 3 in order to adjust the coupling condition between the second coupling capacitor $1_7$ and the resonance micro-strip line $2_1$ and adjust the level of oscillation signal supplied to the second coupling capacitor $1_7$. Since there is no other difference on the function and operation between the second mounting structure and the first mounting structure, further explanation of the function and operation, of the second mounting structure will be omitted here.

As explained above, according to the present invention, the resonance micro-strip line of resonance circuit is inserted and connected to the DC circuit between the collector of the first (oscillation) transistor and the emitter of the second (amplification) transistor in order to eliminate an inductor as the factor for generating irregular oscillation, therefore the present invention provides the effect that the resonance circuit may be formed with the resonance micro-strip line and resonance capacitor and simultaneously it is possible to prevent generation of irregular oscillation.

Moreover, according to the present invention, the number of parts of the voltage-controlled oscillator can be reduced and moreover the number of parts of the irregular oscillation control circuit can also be reduced by using at least the resonance micro-strip line, and moreover since a large size part such as inductor element is also included to such parts to be reduced, the total structure of the voltage-controlled oscillator can be more reduced in size than the total structure of the voltage-controlled oscillator of the related art.

In addition, according to the present invention, since the coupling capacitor to transmit the oscillation signal is connected between the intermediate tap of the resonance micro-strip line and the base of the amplifying transistor and an output level of the oscillation signal is adjusted by changing the forming position and forming condition of the intermediate tap of the micro-strip line, the output level of oscillation signal can be adjusted through comparatively simplified work.

What is claimed is:

1. A voltage-controlled oscillator comprising: an oscillating transistor which operates in a grounded base system to output an oscillation signal; an amplifying transistor which operates in a grounded emitter system to amplify the oscillation signal; and a resonance circuit connected to the collector of the oscillating transistor, wherein the resonance circuit includes a micro-strip line with an intermediate tap connected to a DC circuit provided between the collector of the oscillating transistor and the emitter of the amplifying transistor and a resonance capacitor connected to the collector of the oscillating transistor and the ground point, and a coupling capacitance to transmit the oscillation signal connected between the intermediate tap of the micro-strip line and the base of the amplifying transistor.

2. A voltage-controlled oscillator according to claim 1, comprising a mounting structure wherein an upper layer mounting individual structural elements including the oscillating transistor and the amplifying transistor, an intermediate layer forming the micro-strip line, and a lower layer forming a ground layer are arranged opposed adjacently to each other under an insulating condition, a first conductive pattern and a second conductive pattern forming the coupling capacitor are arranged opposed to each other to the upper and intermediate layers, and the first conductive pattern is connected to the intermediate tap of the micro-strip line and the second conductive pattern is connected to the base of the amplifying transistor.

3. A voltage-controlled oscillator according to claim 2, wherein the second conductive pattern is attained by widening a conductive pattern which forms the intermediate tap of the micro-strip line.

\* \* \* \* \*